US006722894B2

(12) United States Patent
Burmeister

(10) Patent No.: US 6,722,894 B2
(45) Date of Patent: Apr. 20, 2004

(54) PLUG CONNECTOR FOR ESTABLISHING AN ELECTRICAL CONTACT BETWEEN A FLEXIBLE CONDUCTOR FOIL AND A CIRCUIT BOARD

(75) Inventor: Michael Burmeister, Böcklinweg (DE)

(73) Assignee: Harting Electro-Optics GmbH & Co. KG (DE)

( * ) Notice: Subject to any disclaimer, the term of this patent is extended or adjusted under 35 U.S.C. 154(b) by 0 days.

(21) Appl. No.: 10/287,961

(22) Filed: Nov. 5, 2002

(65) Prior Publication Data

US 2003/0087539 A1 May 8, 2003

(30) Foreign Application Priority Data

Nov. 6, 2001 (DE) ........................................ 101 54 370

(51) Int. Cl.$^{7}$ .......................... H01R 12/00; H05K 1/00
(52) U.S. Cl. .......................................... 439/67; 439/493
(58) Field of Search .......................... 439/78, 67, 493, 439/499, 632

(56) References Cited

U.S. PATENT DOCUMENTS 4,379,608 A 4/1983 Olsson et al.
4,871,315 A * 10/1989 Noschese ..................... 439/67
6,077,124 A 6/2000 Etters et al.
6,551,113 B1 * 4/2003 Nishiyama et al. ........... 439/67

FOREIGN PATENT DOCUMENTS

| | | | |
|---|---|---|---|
| DE | 40 18 947 A 1 | 1/1992 | ......... H01R/13/631 |
| DE | 199 44 493 A 1 | 3/2001 | ......... H01R/13/631 |

* cited by examiner

*Primary Examiner*—Hae Moon Hyeon
(74) *Attorney, Agent, or Firm*—Hayes Soloway P.C.

(57) ABSTRACT

A plug connector for establishing an electrical contact between first and second conducting track carriers, in particular between a flexible conductor foil and a circuit board, comprises a plug part that has a plug housing provided with a cam surface. The first conducting track carrier is shiftably mounted to the plug housing such that it can be shifted starting from an advanced initial position into a retracted contact position and parallel to a plug-in direction of the plug part. The plug connector further comprises a socket part that includes a socket housing, a pressure application spring and the second conducting track carrier which is received in the socket housing. The pressure application spring has two ends, one end of which forms a supported end received in the socket housing and the other end forms a pressing end that cooperates with the first conducting track carrier if the latter is in the contact position. The pressing end of the pressure application spring is set under tension by the can surface during inserting the plug part into the socket part and is released not until the plug part is inserted in the socket part to such an extent that the first conducting track carrier has reached its contact position.

12 Claims, 8 Drawing Sheets

PLUG CONNECTOR FOR ESTABLISHING AN ELECTRICAL CONTACT BETWEEN A FLEXIBLE CONDUCTOR FOIL AND A CIRCUIT BOARD

TECHNICAL FIELD

The invention relates to a plug connector for establishing an electrical contact between first and second conducting track carriers, in particular between a flexible conductor foil and a circuit board.

BACKGROUND OF THE INVENTION

Originally, conventional plug connectors have been employed for connecting the conducting tracks of two circuit boards with each other. A plug part was attached to one of the circuit boards and a socket part was attached to the other circuit board. By inserting the plug contacts of plug part and socket part into each other, the conducting tracks of the two circuit boards could be connected with each other.

A further development of these plug connectors is to insert one of the circuit boards directly into a socket part of the plug connector, so that contacts provided in the socket part directly make contact with the conducting tracks of the inserted circuit board. One example of such a plug connector is to be found in DE 40 18 947 A1. In the device shown therein, the circuit board to be inserted is provided with an actuation element that has the shape of two noses protruding on both sides of the circuit board to be inserted. During a first phase of insertion, the circuit board can be inserted into the socket part virtually with zero insertion force, since the contacts of the socket part are held at a distance from the circuit board. In a second phase, the noses provided on the circuit board engage the contacts in the socket part, so that the contacts are forced against the circuit board and the final contact force is made available.

A further plug connector is known from DE 199 44 493 A1. It serves in particular for connecting a conductor foil. For making contact with the conducting tracks of the conductor foil, there are provided clip-like contacts in the socket part, the two ends of which resiliently rest against each other. Provided on one of these ends is an actuation arm which cooperates with an actuation protrusion on the plug part carrying the conductor foil. When the plug part is inserted, the clip-like contact is opened during a first insertion phase by acting on the actuation arm, so that the conductor foil can be pushed into the contact. In a second phase, the actuation arm is released again, so that the contact closes and the two ends of the clip-like contact rest on the upper and lower sides of the conductor foil.

It is a disadvantage of these known plug connectors that during insertion of the circuit board or the conductor foil a relative motion inevitably occurs between conducting track or conductor foil on the one hand, and the conducting tracks of conductor foil and circuit board on the other hand, which is necessary for compensating tolerances of the components. This relative motion results in high stress on the conducting tracks, in particular if they are designed so as to be very filigree, as well as in a “dead” conducting track section, i.e. that part of the conducting track which lies behind the contact point and has detrimental effects with high signal transmission speed. A further disadvantage, both in terms of the constructional expenditure and the quality of signal transmission, is the fact that contacts are required which engage the conducting tracks of circuit board and conductor foil, respectively, and which are connected with the conducting tracks of the other conductor foil and circuit board, respectively.

Thus, it is the object of the invention to provide a plug connector in which the conducting tracks, during inserting and contacting, are able to be joined not by a relative motion, but in the nature of a precise spot-landing.

BRIEF SUMMARY OF THE INVENTION

According to the invention, a plug connector for establishing an electrical contact between first and second conducting track carriers, in particular between a flexible conductor foil and a circuit board, comprises a plug part that has a plug housing provided with a cam surface. The first conducting track carrier is shiftably mounted to the plug housing such that it can be shifted, parallel to a plug-in direction of the plug part, starting from an advanced initial position into a retracted contact position. The plug connector further comprises a socket part that includes a socket housing, a pressure application spring and the second conducting track carrier which is received in the socket housing. The pressure application spring has two ends, one end of which forms a supported end received in the socket housing and the other end forms a pressing end that cooperates with the first conducting track carrier if the latter is in the contact position. The pressing end of the pressure application spring is set under tension by the cam surface during inserting the plug part into the socket part and is released not until the plug part is inserted in the socket part to such an extent that the first conducting track carrier has reached its contact position. The most essential aspect of such plug connector is that the conducting track carrier, e.g. a flexible conductor foil or a circuit board housed in the plug part, remains stationary after it has reached its optimum contact position with respect to the conducting track carrier received in the socket housing, while the plug part can be pushed further into the socket part. This motion of the plug part relative to the socket part, with the conducting track carrier of the plug part being stationary at the same time, is used for actuating the pressure application spring which acts on the stationary conducting track carrier of the plug part when it is released again, and forces the conducting track carrier against the opposite conducting track carrier in the socket part. In other words, the movable attachment of the conducting track carrier in the socket part makes it possible to timely separate the two processes of inserting the conducting track carrier into the socket part, on the one hand, and actuating the pressure application spring, on the other, such that the pressure application spring is released not until the conducting track carrier has reached its contact position and a further motion relative to the opposite conducting track carrier of the socket part is not possible any more. It is in this way that the conducting tracks of the two conducting track carriers are not joined by a mutual relative motion, but are forced against each other in the nature of a precise spot-landing only when they have assumed their desired position relative to each other and if possible tolerances during insertion have been compensated already. Since the conducting tracks directly rest on each other, intermediate contact elements are not required either.

According to the preferred embodiment of the invention it is provided for that the first conducting track carrier is a molded plastics circuit board which is arranged on a carriage and that a sliding guide is provided by means of which the carriage is shiftably attached to the plug housing. Further, it is preferably provided for that the second conducting track carrier is a flexible conductor foil. In the case of a molded plastics circuit board, very filigree conducting tracks can be configured at a comparably low expenditure, which what is more may also be provided with raised contact points at their ends. These contact points are particularly of advantage for contacting the conducting tracks of a flexible conductor foil.

It is preferably provided for that the carriage is arranged on the plug housing so as to be also shiftable in a direction perpendicular to the plug-in direction. This may be achieved in that the sliding guide releases the carriage, as soon as the latter has reached the contact position, in a manner such that it can be lifted by the pressing end of the pressure application spring in a direction perpendicular to the plug-in direction and towards the second conducting track carrier. With this design, the sliding guide makes it possible for the carriage to bring about the two relative motions between the conducting track carriers to be contacted, which motions are required for establishing the contact, namely additionally to the shifting motion parallel to the plug-in direction also a shifting motion perpendicularly thereto in order to press the two conducting track carriers against each other. With this, the supported end of the pressure application spring can be firmly held on the socket housing, which simplifies construction.

According to the preferred embodiment of the invention it is provided for that the circuit board of the plug part is connected with a second conductor foil, the second conductor foil extending as far as to a solder surface on the end of the plug housing facing away from the carriage, so that the second conductor foil can be connected there with conducting tracks of a plug card to which the plug part is attached. Using a flexible conductor foil results in the advantage that the conducting tracks of the plastics circuit board can be contacted without impairing the movability of the plastics circuit board attached to the shiftable carrier. The conducting tracks of the plastics circuit board and of the flexible conductor foil can easily be connected with each other by means of bonding wires.

Preferably it is provided for that the solder surface extends on the plug housing at an angle of approximately 20° relative to the plane of the plug card. As the conductor foil extends obliquely away from the soldering spot, there will be produced a clearance which allows a visual check of the soldered connection obtained.

Preferably it is provided for that plug contacts are arranged on the plug housing, which are capable of cooperating with complementary plug contacts in the socket housing. It is in this way that additional signals are able to be transmitted. The plug contacts may also serve for power transmission, so that together with the transmission path between the two conducting track carriers there will be obtained a very high level of integration in the plug connector.

DETAILED DESCRIPTION OF THE PREFERRED EMBODIMENTS

Figure 1:
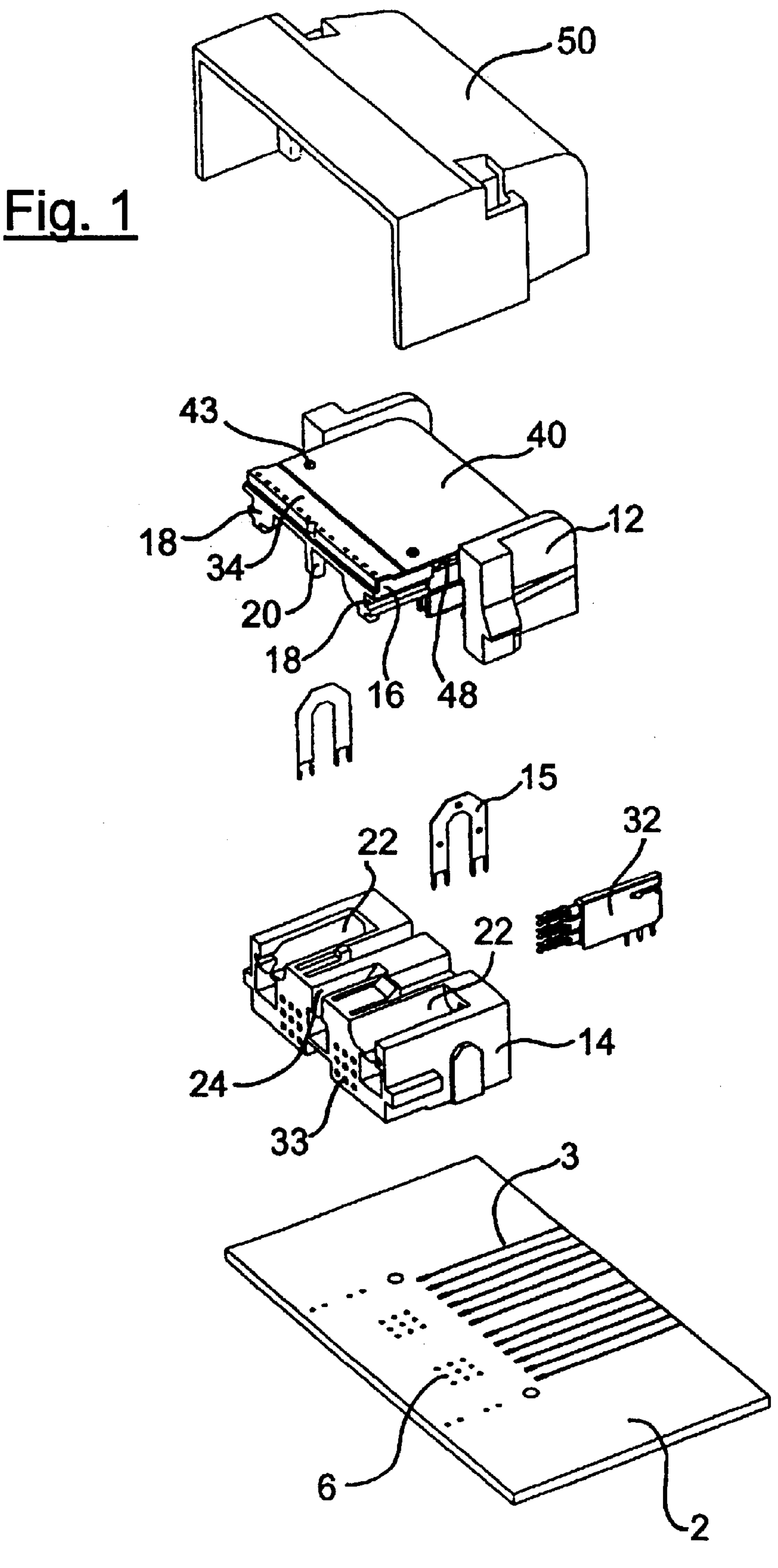
FIG. 1 shows in an exploded view the components of the plug part of the plug connector according to the invention.

The plug connector 1 (see FIG. 8) comprises on the one hand a plug part 10 which in this case is attached to a plug card 2. The plug card 2 is provided with conducting tracks 3 (see FIG. 1) on its upper side. Similar conducting tracks may be provided on the lower side. On the other hand, the plug connector 1 comprises a socket part 60 which here is attached to a carrier card 4. A cable 5 is inserted into the socket part 60 and serves for signal transmission.

It is to be noted that the terms "plug part" and "socket part" merely serve for distinguishing the two elements of the plug connector and do not allow any statement to the effect which one of the parts of the plug connector is inserted into the other. Thus, all components which are described as components of the plug part in the following, may also be arranged in the other part of the plug connector, i.e. the part designated as socket part, and vice versa.

Figure 2:
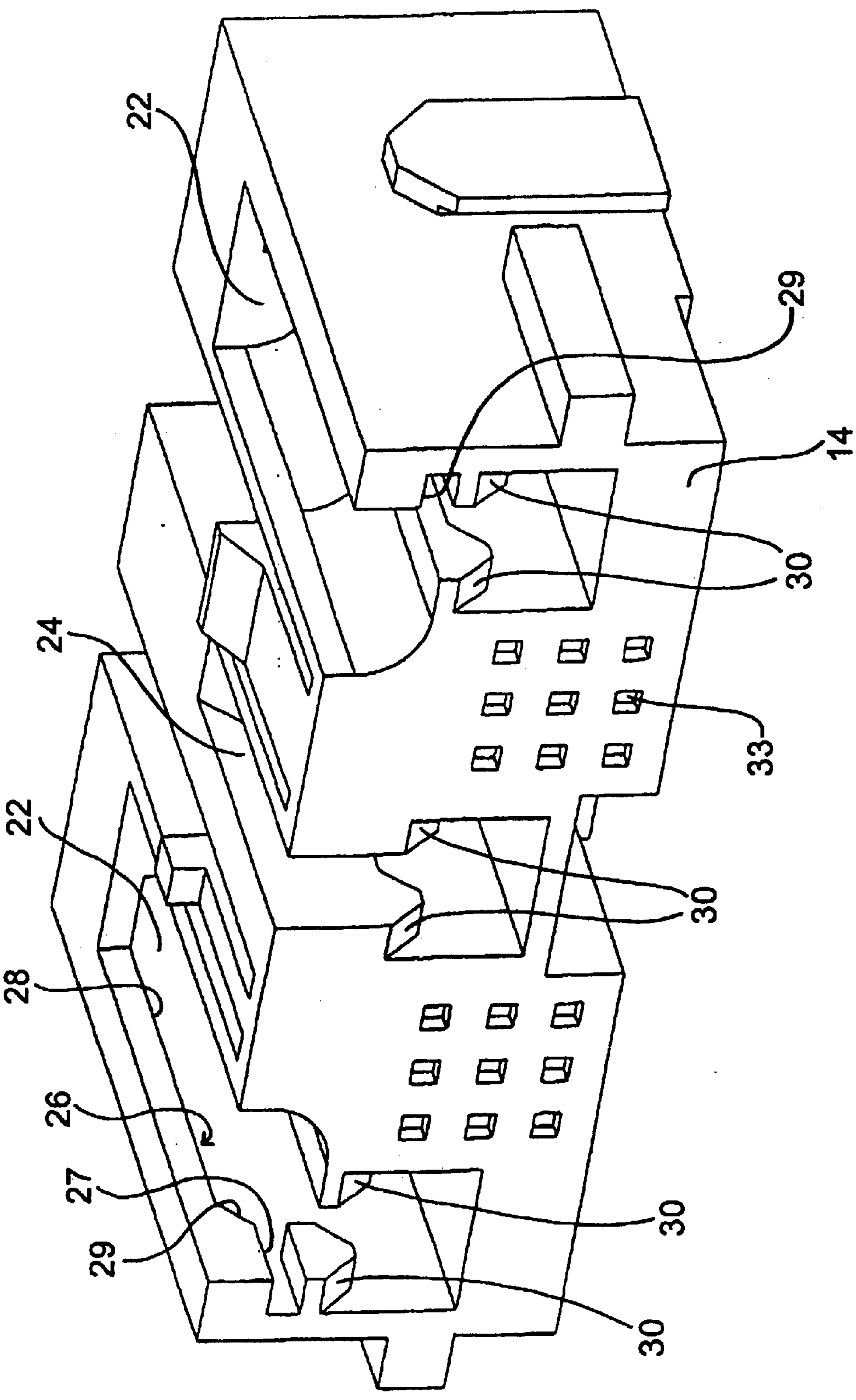
FIG. 2 shows in an enlarged view a part of the plug housing of the plug part of FIG. 1.
Figure 3:
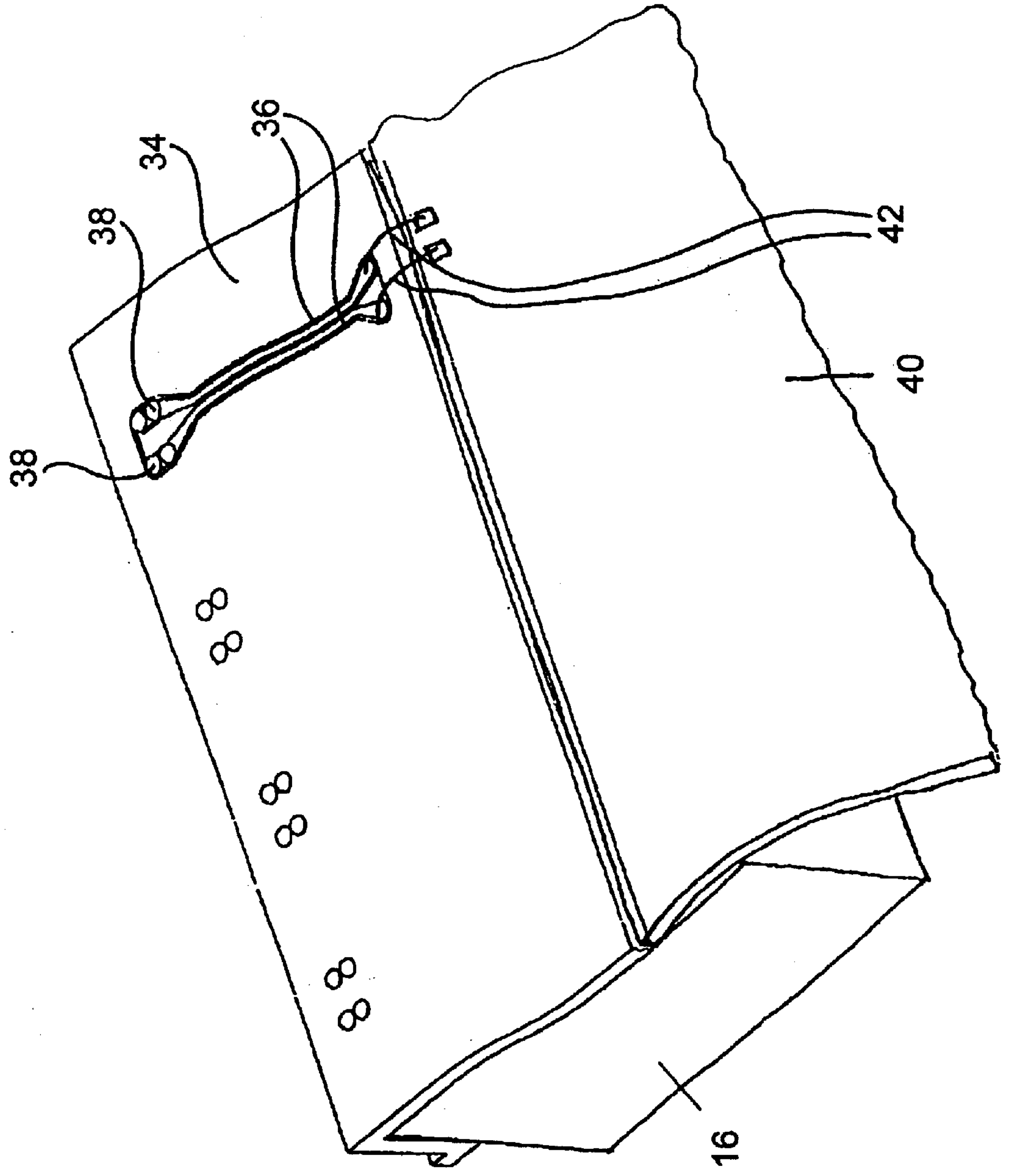
FIG. 3 shows in an enlarged and schematic view the carriage used in the plug part of FIG. 1.
Figure 4:
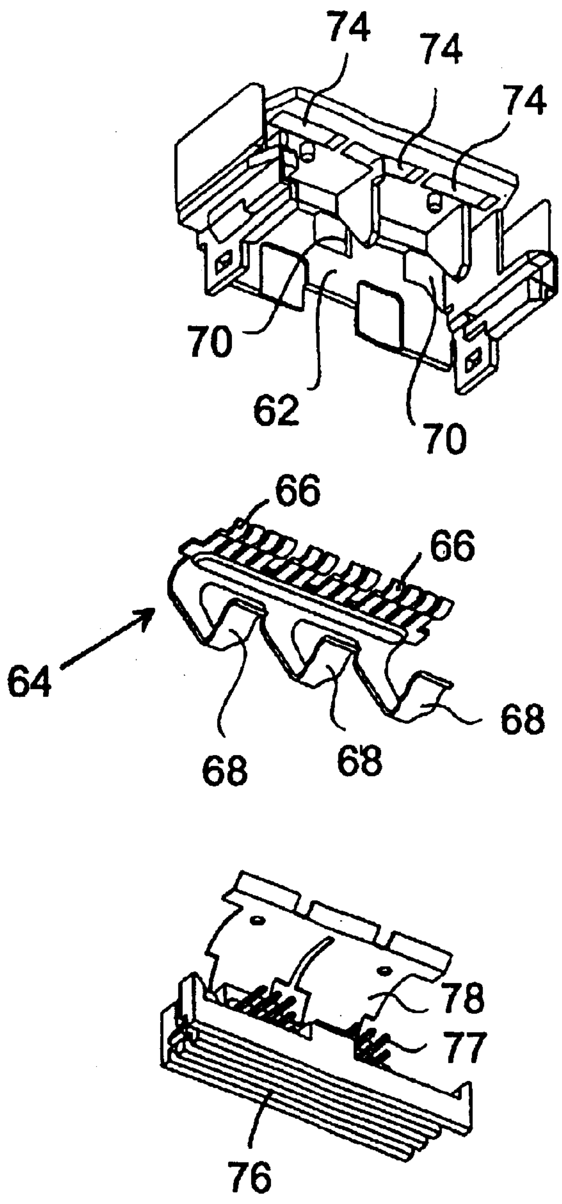
FIG. 4 shows in a first perspective view an exploded illustration of the socket part used in the plug connector according to the invention.
Figure 5:
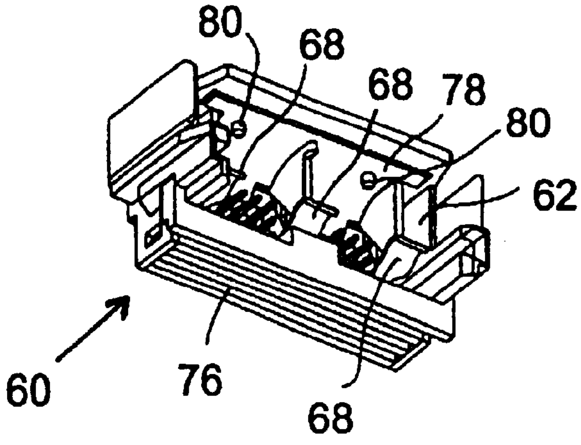
FIG. 5 shows in the first perspective view the socket part when mounted.
Figure 6:
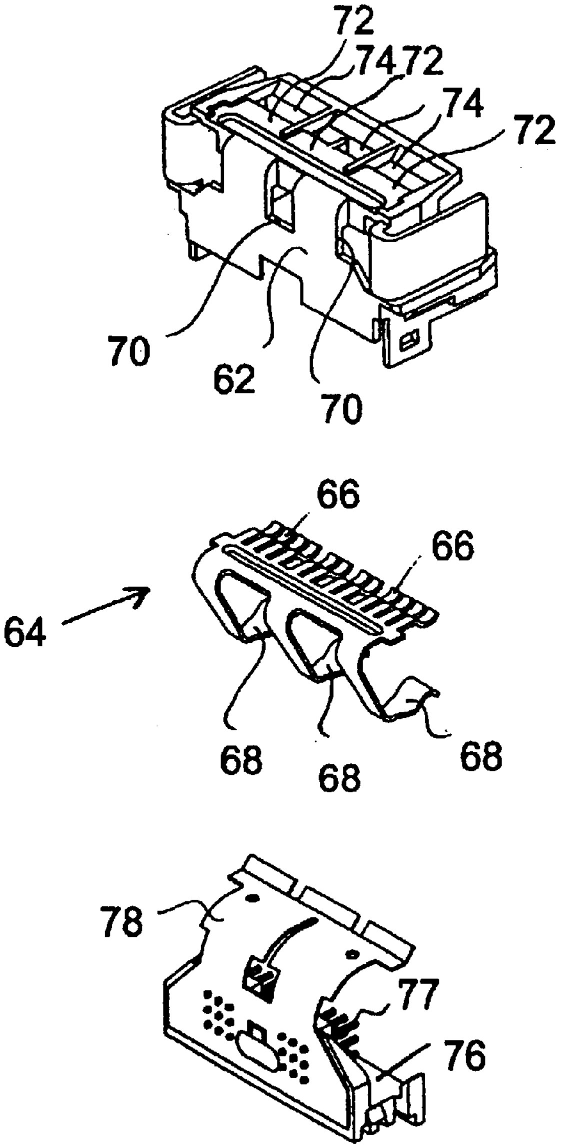
FIG. 6 shows the socket part of FIG. 4 in a second perspective view.
Figure 7:
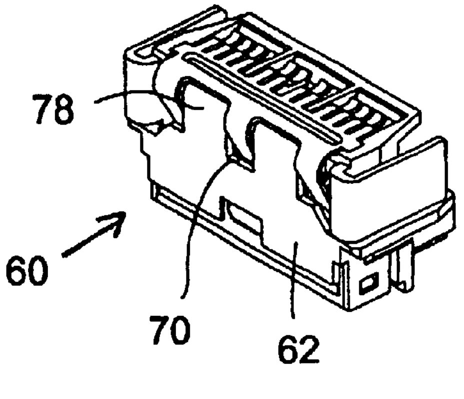
FIG. 7 shows the socket part of FIG. 5 in the second perspective view.

The plug part 10 (see in particular FIGS. 1 to 3) comprises a plug housing which is formed by a retaining part 12 and a carriage guiding part 14 (see also FIG. 2). A carriage 16 (see also FIG. 3) is attached to the plug housing in such a manner that it can be shifted relative to the carriage guiding part 14. To this end, carriage 16 is provided with two externally arranged webs 18 and a centrally provided nose 20, which engage two externally arranged slots 22 as well as a central groove 24 in the carriage guiding part 14.

The two externally arranged slots 22 are each provided with a sliding guide 26 that has a front section 27, a rear section 28 as well as a transition section 29. The front and rear sections 27, 28 are arranged offset to each other; however, both sections extend parallel to the plug-in direction along which the plug part 10 is inserted into the socket part 60. The transition section 29 extends obliquely between the front section 27 and the rear section 28. At each of the front ends of the two slots 22 and of the groove 24, there are arranged two cam surfaces 30 each consisting of an obliquely extending front side, a lower side extending parallel to the plug-in direction, and an obliquely extending rear side. The function of the sliding guides 26 and the cam surfaces 30 will be explained below.

Formed in the carriage guiding part 14 are contact chambers (not shown), with plug contacts 32 inserted therein. Complementary plug contacts, which are arranged in the plug part and can be inserted into openings 33 in the carriage guiding part, can be inserted into the plug contacts which here are realized as contact springs. The plug contacts 32 are provided with solder-in pins that can be soldered in place in contact holes 6 of the plug card 2. There are also provided holding clips 15 for mechanically fastening the carriage guiding part 14 on the plug card 2; these holding clips can be slipped on corresponding projections of the carriage guiding part 14 and engage retaining holes of the plug card 2.

Arranged on the carriage 16 (see FIG. 3) is a first conducting track carrier which here is realized as a molded circuit board 34 made of plastics. Basically, it is also possible to use any conducting track carrier at that place, for example a conventional circuit board, a conductor foil etc. The plastics circuit board 34 is configured substantially in an L-shape, with the short leg resting at the front side of the carriage 16 and serving for positioning. On the upper side of the plastics circuit board 34 there are formed several conducting tracks 36 which each are provided with two raised contact points 38 at their front end. The contacts points have a height of approximately 0.1 mm.

Adjoining the rear side of the plastics circuit board 34 is a flexible conductor foil 40 which likewise is provided in a manner known per se with conducting tracks (not illustrated). Bonding wires 42 are used for connecting the conducting tracks 36 of the plastics circuit board 34 with the conducting tracks of the conductor foil 40.

The plastics circuit board 34 as well as the flexible conductor foil 40 are joined with the carriage 16 by gluing. In addition, two centering pins 43 are provided on the carriage which engage corresponding openings of the flexible conductor foil 40.

The end of the conductor foil 40 facing away from the plastics circuit board 34 extends as far as to a solder surface 44 on the retaining part 12 (see FIG. 8) and is fastened to that place. To this end, a fastening surface 46 is formed on the retaining part 12, this surface extending at an angle of approximately 20° relative to the plane of the plug card 2.

For mounting the plug part 1 the carriage 16 is mounted to the carriage guiding part 14 in such a manner that the webs 18 and the nose 20 of the carriage engage the slots 22 and the groove 24 of the carriage guiding part 14. A return spring 48 is installed which biases the carriage 16 relative to the carriage guiding part 14 in an advanced initial position. The initial position of the carriage 16 is to be seen in FIG. 8.

On attaching the plug housing 12, 14 to the plug card 2, the solder-in pins of the plug contacts 32 engage into the contact holes 6 of the plug card 2 where they can be soldered in place in a conventional manner. The conducting tracks of the flexible conductor foil 40, too, can be soldered in a manner known per se with the conducting tracks 3 on the plug card 2; however, due to the oblique arrangement of the fastening surface 46 there is possible both a good transfer of heat to the solder spots and, after completion of the soldering process, a visual check of the solder spots. This represents an essential improvement vis-à-vis the state of the art. Finally, a cover 50 is placed on the plug part 10.

The socket part 60 comprises a socket housing 62 (see FIGS. 4 to 7) which may consist of electrically insulating plastics, just like the plug housing 12, 14. Introduced in the socket housing 62 is a pressure application spring 64 which generally has the shape of a C, when viewed from the side. A first end of the pressure application spring 64 forms a supported end 66 which is provided here with a plurality of individual spring tabs lying side by side. The other end of the pressure application spring 64 forms a pressing end 68 which is embodied in the form of three tabs lying side by side. The pressure application spring 64 is installed in the socket housing 62 such that the pressing end 68 extends right through passage openings 70 in the socket housing 62 into the interior space of the socket housing, while the supported end 66 is arranged on an upper support surface 72 of the socket housing 62. In this arrangement, the spring tabs of the supported end 66 are received in recesses 74 which are adjacent to the supporting surface 72.

An electrical or electro-optical component 76 is arranged on the socket housing 62 and some terminals thereof are electrically connected with the conducting tracks of a flexible conductor foil 78. The electro-optical component also has several plug contacts 77 which are associated to the plug contacts 32 of the plug part 10.

Here, the flexible conductor foil 78 forms the second conducting track carrier which is intended to connect the first conducting track carrier in the plug part. The flexible conductor foil 78 is guided between the tabs of the pressing end 68 of the pressure application spring 64 such that it comes to lie between the supporting surface 72 and the supported end 66 and extends beyond the recesses 74 in the socket housing 62. Thus, the conducting tracks to be contacted lie underneath the spring tabs of the supported end 66. Centering pins 80 are provided for positioning the flexible conductor foil 78, which engage in corresponding openings of the conductor foil. The socket housing preassembled in this way is placed in a cover 82 which is attached to the carrier card 4 (see FIG. 8).

Figure 8:
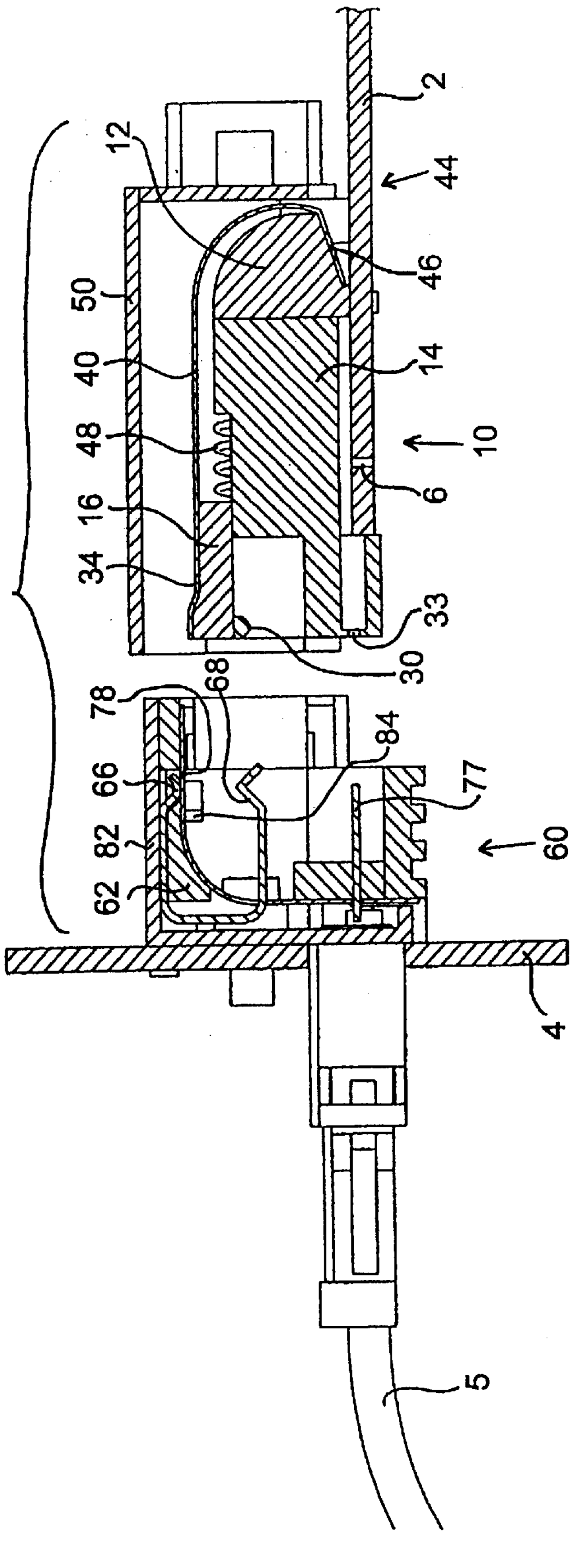
FIG. 8 shows in a sectional view the plug connector according to the invention, prior to the plug part being inserted into the socket part.

Prior to inserting the plug part 10 into the socket part 60, the carriage 16 is in the initial position illustrated in FIG. 8, i.e. in a position advanced with respect to the plug-in direction, where it is held by the return spring 48. In this position the carriage 16 is positioned by the front section 27 of the sliding guide 26.

On inserting the plug part 10, the carriage 16 comes to rest at a stop 84 of the socket housing 62, so that the carriage together with the plastics circuit board 34 attached to it is no longer able to move further relative towards the conductor foil 78 of the socket part. At the same time, the pressing end 68 of the pressure application spring 64 is bent downwards by the cam surface 30 on the carriage guiding part and is set under tension at the same time, since the obliquely running front face of the cam surface 30 cooperates with the bent-off end section of the pressing end 68.

Upon further insertion of the plug part 10 into the socket part 60 the pressing end 68 of the pressure application spring 64 slips over the cam surface 30, so that it is released again behind this surface. At the same time and upon further insertion of the plug part 10, the carriage 16—due to it resting against the stop 84 of the socket housing 62—is shifted relative to the carriage guiding part 14 such that it leaves the front section 27 of the sliding guide 26. Therefore, the pressing end 68 of the pressure application spring 64 can lift the carriage 16 as soon as it is behind the cam surface 30, and can force the plastics circuit board 34 arranged on the carriage, including the contact points 38, against the conducting tracks of the conductor foil 78. Due to the stop 84 being arranged in the socket housing 62, the contact points 38 will meet the conductor foil 78 precisely in the region of the recesses 74 and the spring tabs of the supported end 66 which are arranged behind them, so that the pressing force of the pressure application spring acts as a contact force without any loss of force. Since the carriage 16 is lifted by the pressure application spring both on its two outer edges and in the center at the nose, a uniform pressing against the conductor foil 78 is ensured. The condition of the plug connector with the carriage 16 lifted is shown in FIG. 9.

Figure 9:
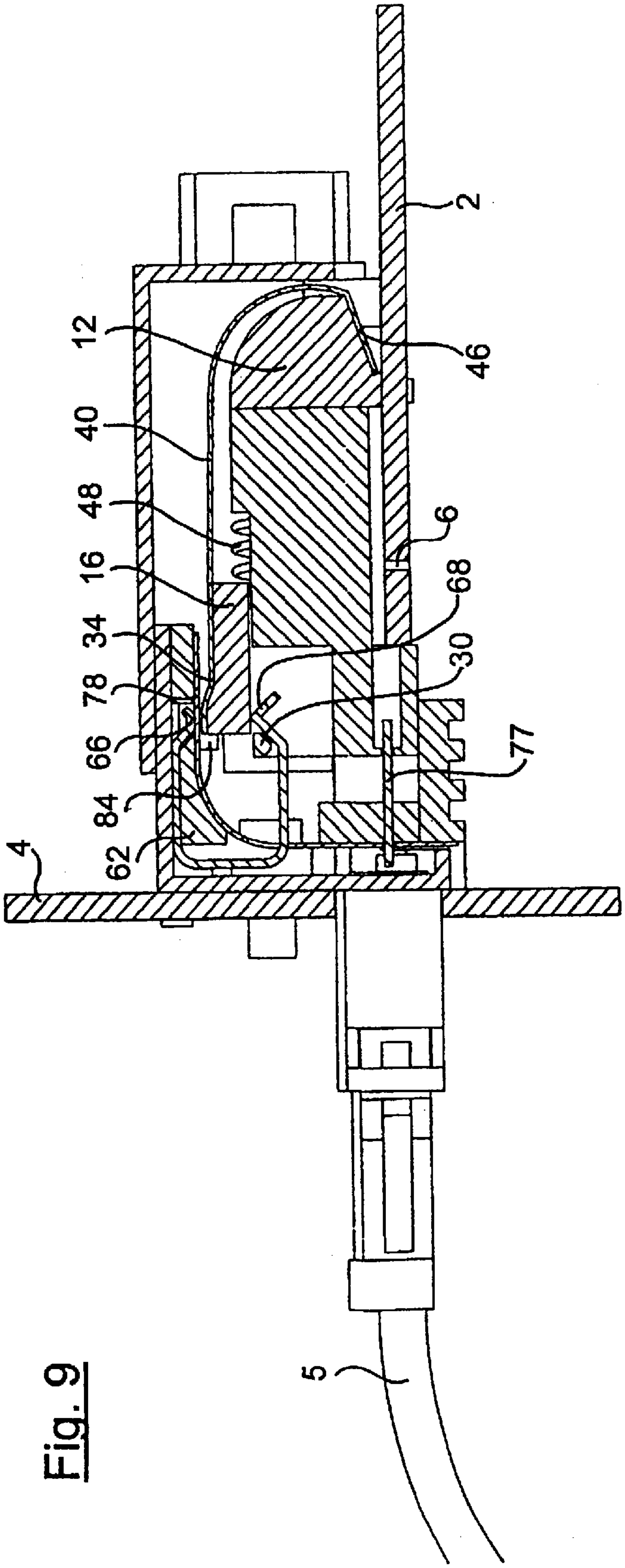
FIG. 9 shows the plug connector of FIG. 8, the plug part being partially inserted in the socket part.
Figure 10:
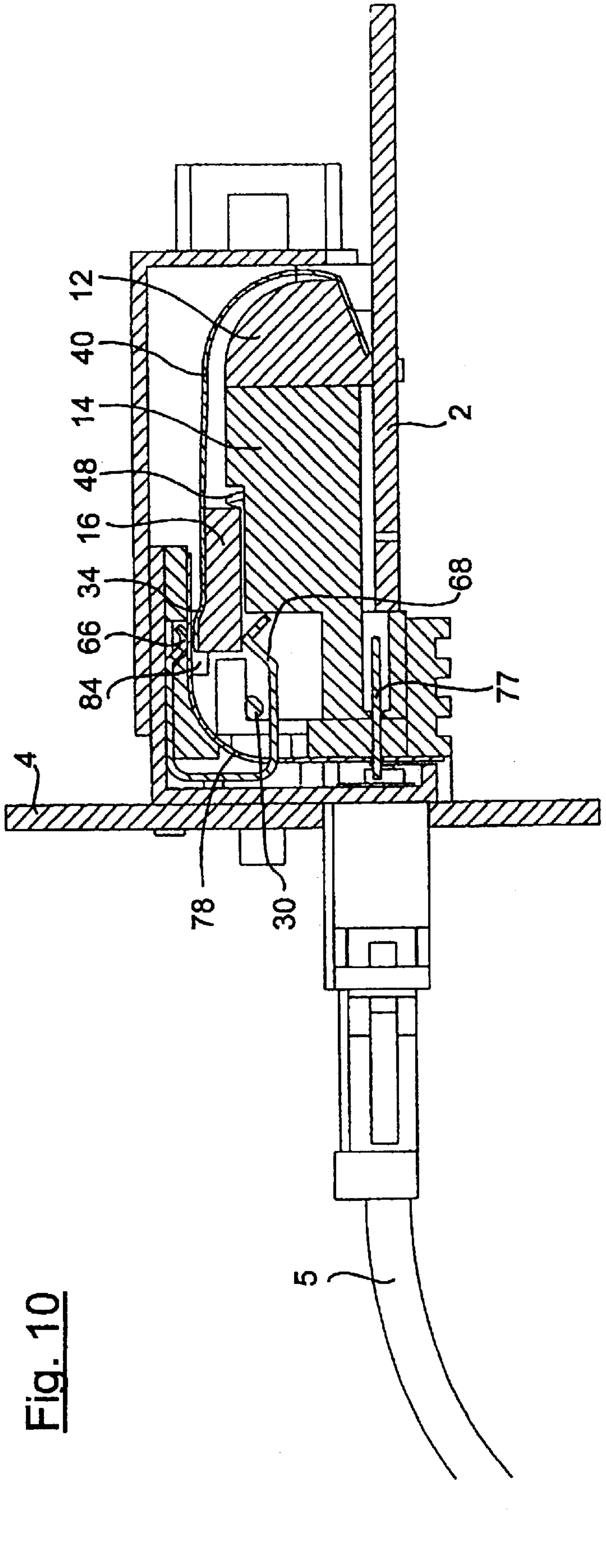
FIG. 10 shows the plug connector of FIG. 8, the plug part being completely inserted in the socket part.

If, starting from the position shown in FIG. 9, the plug part 10 is pushed further into the socket part 60, the carriage 16 remains in its position relative to the pressure application spring 64 and the socket housing 62. The relative motion between the carriage 16 and the plug housing 12, 14 is neither impeded by the return spring 48 nor by the flexible conductor foil 40; the flexible conductor foil 40, in fact, can swerve into the space enclosed by the cover 50. The relative displacement between plug part 10 and socket part 60, after contact between the plastics circuit board 34 and the flexible conductor foil 78 of the socket part 60, makes it possible that the plug contacts 77 of the socket part 60 reliably engage the plug contacts 32 of the plug part 10.

During disengaging the plug connection, the process described above will take place in the reverse order. The pressing end 68 of the pressure application spring 64 will be lifted from the carriage 16 by the cam surface 30, before the carriage moves relative to the conductor foil 78. When the plug part 10 is further pulled out of the socket part 60, the carriage will be lifted from the conductor foil 78 by means of the transition section 29 and the front section 27 of the sliding guide 26, so that the separation of the contact surfaces will take place without any relative motion.

The plug connector described allows to establish a reliable contacting between a circuit board and a flexible conductor foil on smallest space, the contact force acting on the conductor foil and the circuit board only when the two parts do not move relative to each other any more. Thus, with a contact force acting, a relative motion between these two parts is prevented and making contact in a spot-landing fashion is made possible. A high level of integration is achieved by the plug contacts being additionally present.

What is claimed is:

1. A plug connector for establishing an electrical contact between first and second conducting track carriers, in particular between a flexible conductor foil and a circuit board, said plug connector comprising a plug part that has a plug housing provided with a cam surface, said first conducting track carrier being shiftably mounted to said plug housing such that it can be shifted, parallel to a plug-in direction of said plug part, starting from an advanced initial position into a retracted contact position, and further comprising a socket part that includes a socket housing, a pressure application spring and said second conducting track carrier which is received in said socket housing, said pressure application spring having two ends, one end of which forming a supported end received in said socket housing and the other end forming a pressing end cooperating with said first conducting track carrier if the latter is in said contact position, said pressing end of said pressure application spring being set under tension by said cam surface during inserting said plug part into said socket part and being released not until said plug part is inserted in said socket part to such an extent that said first conducting track carrier has reached its contact position.

2. The plug connector according to claim 1, wherein at least one of said conducting track carriers is a flexible conductor foil.

3. The plug connector according to claim 1, wherein at least one of said conducting track carriers is a circuit board.

4. The plug connector according to claim 1, wherein said first conducting track carrier is a molded plastics circuit board that is arranged on a carriage and wherein a sliding guide is provided by means of which said carriage is shiftably mounted to said plug housing.

5. The plug connector according to claim 4, wherein a return spring is provided which biases said carriage into said initial position.

6. The plug connector according to claim 4, wherein said carriage is also arranged so as to be shiftable in a direction perpendicular to said plug-in direction.

7. The plug connector according to claim 6, wherein said sliding guide releases said carriage, as soon as the latter has reached said contact position, in a manner such that it can be shifted by said pressing end of said pressure application spring in a direction perpendicular to said plug-in direction and towards said second conducting track carrier.

8. The plug connector according to claim 4, wherein said second conducting track carrier is a flexible conductor foil.

9. The plug connector according to claim 4, wherein said circuit board of said plug part is connected with a second conductor foil, said second conductor foil extending as far as to a solder surface on an end of said plug housing facing away from said carriage, so that said second conductor foil can be connected there with conducting tracks of a plug card to which said plug part is mounted.

10. The plug connector according to claim 9, wherein said conducting tracks of said circuit board are connected with said conducting tracks of said second conductor foil by means of bonding wires.

11. The plug connector according to claim 9, wherein said solder surface extends on said plug housing at an angle of approximately 20° relative to a plane of said plug card.

12. The plug connector according to claim 1, wherein plug contacts are arranged on said plug housing, which are capable of cooperate with complementary plug contacts in said socket housing.

* * * * *

UNITED STATES PATENT AND TRADEMARK OFFICE

CERTIFICATE OF CORRECTION

PATENT NO. : 6,722,894 B2
DATED : April 20, 2004
INVENTOR(S) : Burmeister

It is certified that error appears in the above-identified patent and that said Letters Patent is hereby corrected as shown below:

Title page,
Item [57], ABSTRACT,
Line 17, “the can surface” should be -- the cam surface --.

Signed and Sealed this

Nineteenth Day of April, 2005

JON W. DUDAS
*Director of the United States Patent and Trademark Office*